United States Patent
Yang et al.

(10) Patent No.: US 11,608,556 B2
(45) Date of Patent: Mar. 21, 2023

(54) ALLOY-COATED STEEL SHEET AND MANUFACTURING METHOD THEREOF

(71) Applicants: POSCO, Pohang-si (KR); RESEARCH INSTITUTE OF INDUSTRIAL SCIENCE & TECHNOLOGY, Pohang-si (KR)

(72) Inventors: Ji Hoon Yang, Pohang-si (KR); Jae In Jeong, Pohang-si (KR); Yong Hwa Jung, Pohang-si (KR); Tae Yeob Kim, Pohang-si (KR)

(73) Assignees: POSCO HOLDINGS INC., Seoul (KR); RESEARCH INSTITUTE OF INDUSTRIAL SCIENCE & TECHNOLOGY, Pohang-si (KR)

( * ) Notice: Subject to any disclaimer, the term of this patent is extended or adjusted under 35 U.S.C. 154(b) by 468 days.

(21) Appl. No.: 16/626,460

(22) PCT Filed: May 18, 2018

(86) PCT No.: PCT/KR2018/005741
§ 371 (c)(1),
(2) Date: Dec. 24, 2019

(87) PCT Pub. No.: WO2019/004598
PCT Pub. Date: Jan. 3, 2019

(65) Prior Publication Data
US 2020/0385854 A1     Dec. 10, 2020

(30) Foreign Application Priority Data
Jun. 27, 2017  (KR) .......... 10-2017-0081451

(51) Int. Cl.
*B32B 15/01*     (2006.01)
*C23C 14/58*     (2006.01)
(Continued)

(52) U.S. Cl.
CPC ........ *C23C 14/5806* (2013.01); *B32B 15/012* (2013.01); *C21D 9/46* (2013.01);
(Continued)

(58) Field of Classification Search
None
See application file for complete search history.

(56) References Cited

U.S. PATENT DOCUMENTS

2015/0013409 A1   1/2015  Monnoyer et al.
2019/0001623 A1*  1/2019  Yang .................. C22C 21/08

FOREIGN PATENT DOCUMENTS

| CN | 1809653 | 7/2006 |
| CN | 103282534 | 9/2013 |

(Continued)

OTHER PUBLICATIONS

European Search Report—European Application No. 18825546.7 dated Apr. 30, 2020, citing JP 2000 328216, Raghavan, EP 3396017, and EP 1518941.

(Continued)

*Primary Examiner* — Daniel J. Schleis
(74) *Attorney, Agent, or Firm* — Cantor Colburn LLP

(57) ABSTRACT

Provided is an alloy-coated steel sheet and a manufacturing method thereof. The alloy-coated steel sheet includes: a steel sheet; and an Al—Mg—Si alloy layer disposed on the steel sheet, wherein the Al—Mg—Si alloy layer has a form in which Mg—Si alloy grains are included in an alloy layer consisting of an Al—Mg alloy phase.

9 Claims, 20 Drawing Sheets

(51) Int. Cl.
*C21D 9/46* (2006.01)
*C22C 21/02* (2006.01)
*C23C 2/12* (2006.01)
*C23C 2/40* (2006.01)
*C23C 14/16* (2006.01)
*C23C 14/35* (2006.01)
*C23C 28/02* (2006.01)

(52) U.S. Cl.
CPC ............... *C22C 21/02* (2013.01); *C23C 2/12* (2013.01); *C23C 2/40* (2013.01); *C23C 14/16* (2013.01); *C23C 14/35* (2013.01); *C23C 28/021* (2013.01)

(56) References Cited

FOREIGN PATENT DOCUMENTS

| | | |
|---|---|---|
| CN | 104057067 | 9/2014 |
| CN | 104884666 | 9/2015 |
| CN | 108463574 | 8/2018 |
| EP | 1518941 | 3/2005 |
| EP | 3396017 | 10/2018 |
| IN | 201827027067 | 10/2018 |
| JP | H04052284 | 2/1992 |
| JP | 06101043 | 4/1994 |
| JP | 2000328216 | 11/2000 |
| JP | 2000328216 A * | 11/2000 |
| JP | 2001123259 | 5/2001 |
| JP | 2006089822 | 4/2006 |
| JP | 2012523244 | 11/2012 |
| JP | 2014001433 | 1/2014 |
| JP | 2014507559 | 3/2014 |
| JP | 2015227511 | 12/2015 |
| JP | 2018533192 | 11/2018 |
| KR | 20120075196 | 7/2012 |
| KR | 20120134708 | 12/2012 |
| KR | 20130074647 | 7/2013 |
| KR | 20130074648 | 7/2013 |
| KR | 20170076234 | 7/2017 |
| KR | 20170117845 | 10/2017 |
| KR | 20170117846 | 10/2017 |
| KR | 20170117848 | 10/2017 |
| WO | 2013008341 | 1/2013 |

OTHER PUBLICATIONS

Raghavan, Al—Mg—Si (Aluminum-Magnesium-Silicon), Journal of Phase Equilibria and Diffusion, vol. 28, No. 2, 2007, pp. 189-191.
Indian Office Action—Indian Application No. 202047003404 dated Jul. 16, 2021, citing IN 201827027067, CN 103282534, JP 2000-328216, EP 1518941, JP 2001-123259, JP 06-101043, and KR 10-2013-0074647.
Japanese Notice of Allowance—Japanese Application No. 2019-572056 dated Aug. 31, 2021, citing JP 2014-507559, JP 6744413, JP 2014-001433, WO 2013/008341, JP 2012-528244, JP 2015-227511, KR 10-2017-0076234, KR 10-2013-0074647, KR 10-2013-0074648, and US 2015/0013409.
International Search Report—PCT/KR2018/005741 dated Aug. 23, 2018.
Japanese Office Action—Japanese Application No. 2019-572056 dated Jan. 5, 2021, citing JP 2014-507559 and JP 2013-533192.
Chinese Office Action—Chinese Application No. 201880043736.3 dated Apr. 1, 2021, citing CN 108463574, CN 103282534, CN 1809653, JP 2000-328216, CN 104057067, CN 104884666, KR 2013-0074647, and Surface Engineering Handbook.
Qu, et al., Surface Engineering Handbook, Chemical Industry Press, Mar. 1998, pp. 624-628.

* cited by examiner

FIG. 8

| Classification | SEM photograph | Al Mapping | Mg Mapping | Si Mapping | Fe Mapping |
|---|---|---|---|---|---|
| SEM photograph | | | | | |
| 400°C, 120 seconds | | | | | |
| 400°C, 300 seconds | | | | | |
| 400°C, 600 seconds | | | | | |

ALLOY-COATED STEEL SHEET AND MANUFACTURING METHOD THEREOF

CROSS-REFERENCE TO RELATED APPLICATION

This application is a national entry of PCT Application No. PCT/KR2018/005741 filed on May 18, 2018, which claims priority to and the benefit of Korean Application No. 10-2017-0081451 filed on Jun. 27, 2017 in the Korean Patent Office, the entire contents of which are incorporated herein by reference.

BACKGROUND OF THE INVENTION

(a) Field of the Invention

The present invention relates to an alloy-coated steel sheet and a manufacturing method thereof.

(b) Description of the Related Art

Iron is a metal which is the most widely used metal industrially due to rich resources, excellent characteristics, and a low price. Despite these advantages of iron, there is a disadvantage that corrosion occurs in the atmosphere. The corrosion of the iron is a phenomenon in which iron ions are eluted when oxygen or water electrochemically reacts with the iron, and when such a reaction proceeds, an oxide of iron (FeOOH) is generated in an eluted portion, which is called rust. The rust of iron consists of various stoichiometric oxides and hydroxides, and a feature in which oxidation continuously occurs over time is one of the features of iron. The iron is processed and used in various forms, and in the case of automobiles, construction materials and household appliances, cold-rolled steel sheets, that is, cold rolled steel sheets have been mainly used.

A representative method for preventing corrosion of the steel sheet is to plate other metals on the surface of the steel sheet. Types of plated films may be divided into a sacrificial corrosion prevention film and a blocking corrosion prevention film. In the sacrificial corrosion prevention film, a metal such as zinc, magnesium, or aluminum, in which oxidation is easier than iron and rust is easily generated, is coated, and the coated metal is corroded preferentially to protect the steel sheet. In the blocking corrosion prevention film, a metal such as lead or tin, which is more difficult to be corroded than the steel sheet, is coated to block water and oxygen from reaching iron.

In order to prevent the corrosion of the steel sheet, currently, zinc plating has been most widely used. After a zinc-plated steel sheet is developed, various efforts to improve corrosion resistance have been made and one of the efforts is to coat a zinc alloy. A high corrosion resistant material system using an alloy includes Zn—Al, Zn—Ni, Zn—Fe, Zn—Al—Mg, and the like. Such a zinc or zinc alloy-plated steel sheet has been widely used for construction materials and household appliances including automobiles.

Aluminum is also used for preventing corrosion of the steel sheet, and application fields of aluminum are further various unlike zinc. An aluminum film has a beautiful color and excellent corrosion resistance and heat resistance and thus has been used for coating of conductive films of a semiconductor, protective films of magnetic materials or steel sheets, and coating of hyperthermia system of appliances, mufflers for automobiles, etc. in addition to decorative films such as cosmetic cases and accessories.

The aluminum film is manufactured by using a vacuum coating or electroplating or hot dipping method. However, in the case of the electroplating, productivity is deteriorated because the efficiency is low, and thus a hot-dip plating method and a vacuum coating method have been mostly used.

The aluminum plated steel sheet has excellent corrosion resistance, while has a disadvantage that when a defect occurs on the film, the corrosion intensively occurs at the defect portion, and the reason is that aluminum has sacrificial corrosion prevention inferior to zinc. Accordingly, in the case of the hot-dip aluminum plated steel sheet, the thickness of the plated layer is increased to 15 microns ($\mu$m) or more to solve the problems. In the hot-dip aluminum plated steel sheet, since the process is performed at a high temperature, an Al—Fe—Si alloy is made at an interface, and thus there is a disadvantage that workability is poor.

The aluminum film using vacuum coating has been applied in most applications by reducing the thickness, and even in corrosion resistant coating, it is general to coat the aluminum film with a thickness of about several microns. In the case of the aluminum film, when the thickness is several microns or less, red rust is generated at about 72 hours in a salt spray test. Accordingly, improvement of characteristics is required to apply aluminum to the steel sheet as corrosion resistant coating. Further, in the case of the aluminum film, since a sacrificial corrosion prevention characteristic is weak as compared to zinc, there is a disadvantage that once red rust is generated, the red rust is entirely spread for a short time.

Therefore, researches for solving the problems as described above are urgent.

The above information disclosed in this Background section is only for enhancement of understanding of the background of the invention and therefore it may contain information that does not form the prior art that is already known in this country to a person of ordinary skill in the art.

SUMMARY OF THE INVENTION

An exemplary embodiment of the present invention is to provide an alloy-coated steel sheet having a high corrosion resistant characteristic even in a small thickness by forming a sacrificial corrosion prevention alloy-coated film on a steel sheet and a manufacturing method thereof.

An alloy-coated steel sheet according to the present invention includes: a steel sheet; and an Al—Mg—Si alloy layer disposed on the steel sheet, wherein the Al—Mg—Si alloy layer has a form in which Mg—Si alloy grains are included in an alloy layer consisting of an Al—Mg alloy phase.

The alloy-coated steel sheet may further include an Al—Si alloy layer disposed between the steel sheet and the Al—Mg—Si alloy layer.

The Al—Mg—Si alloy layer may have a gradient of an Mg content in the alloy layer.

The Mg content in the Al—Mg—Si alloy layer may be 15 wt % or more and 90 wt % or less with respect to total 100 wt % of the Al—Mg—Si alloy layer.

The Al—Mg alloy phase may include $Al_3Mg_2$ and $Al_{12}Mg_{17}$.

The Al—Mg alloy phase may include Al other than $Al_3Mg_2$ and $Al_{12}Mg_{17}$, and Mg solid-solutioned in the Al.

The Mg—Si alloy grains may include $Mg_2Si$.

The Mg—Si alloy grains may be amorphous.

The content of Mg—Si alloy grains in the Al—Mg—Si alloy layer may be 1 wt % or more and 70 wt % or less with respect to total 100 wt % of the Al—Mg—Si alloy layer.

The alloy-coated steel sheet may further include an Al—Fe—Si alloy layer disposed between the steel sheet and the Al—Mg—Si alloy layer.

The alloy-coated steel sheet may further include an Mg layer; or an Al—Mg alloy layer disposed on the Al—Mg—Si alloy layer.

A manufacturing method of an alloy-coated steel sheet according to the present invention includes: preparing an aluminum plated steel sheet including a plated layer containing Al and Si; forming an Mg coated layer by coating Mg on the aluminum plated steel sheet; and diffusing Mg into the plated layer by heat-treating the aluminum plated steel sheet coated with Mg to form an Al—Mg—Si alloy layer, wherein the Al—Mg—Si alloy layer has a form in which Mg—Si alloy grains are included in an alloy layer consisting of an Al—Mg alloy phase.

In the diffusing of Mg into the plated layer by heat-treating the aluminum plated steel sheet coated with Mg, the aluminum plated steel sheet may be heat-treated at a temperature of 300° C. to 450° C.

In the diffusing of Mg into the plated layer by heat-treating the aluminum plated steel sheet coated with Mg, the aluminum plated steel sheet may be heat-treated for 5 seconds to 600 seconds.

In the diffusing of Mg into the plated layer by heat-treating the aluminum plated steel sheet coated with Mg, the Al—Mg alloy phase may be generated in the Al—Mg—Si alloy layer, and the Al—Mg alloy phase may include $Al_3Mg_2$, and $Al_{12}Mg_{17}$.

In the diffusing of Mg into the plated layer by heat-treating the aluminum plated steel sheet coated with Mg, the Mg—Si alloy grains may be generated in the Al—Mg—Si alloy layer, and the Mg—Si alloy grains may include $Mg_2Si$.

The forming of the Mg coated layer by coating Mg on the aluminum plated steel sheet may be performed by physical vapor deposition (PVD).

BRIEF DESCRIPTION OF THE DRAWINGS

FIG. 8 is an SEM photograph for cross sections of a coated layer before heat treatment and a coated layer heat-treated at 400° C. for 120 seconds, 300 seconds, and 600 seconds.

DETAILED DESCRIPTION OF THE EMBODIMENTS

Figure 1:
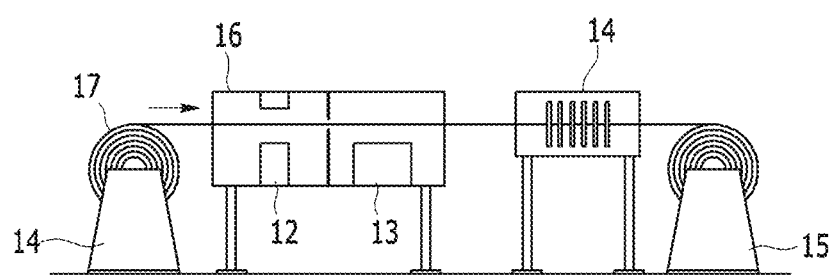
FIG. 1 is a schematic view of a continuous coating device which may be used for manufacturing an alloy-coated steel sheet.

Hereinafter, exemplary embodiments of the present invention will be described in detail. However, the exemplary embodiments are proposed as an example, the present invention is not limited thereto, and the present invention is just defined by a range of claims to be described below.

Unless otherwise defined, all terms (including technical and scientific terms) used in the present specification may be used as the meaning which may be commonly understood by a person with ordinary skill in the art, to which the present invention belongs. Throughout the specification, unless explicitly described to the contrary, the word "comprise" and variations such as "comprises" or "comprising", will be understood to imply the inclusion of stated elements but not the exclusion of any other elements. Unless particularly stated otherwise in the present specification, a singular form also includes a plural form.

In addition, since a size and a thickness of each configuration illustrated in the drawings is arbitrarily shown for ease of description, the present invention is not necessarily limited thereto.

Throughout the specification, it will be understood that when an element such as a layer, a film, a region, or a substrate is referred to as being "on" the other element, it can be directly on the other element or intervening elements may also be present.

Throughout the specification, it will be understood that when an element such as a layer, a film, a region, or a substrate is referred to as being "above" or "on" the other element, it is meant that the element is disposed on or below a target element and it is not necessarily meant that the element is disposed on the upper side based on a direction of gravity.

Throughout the specification, unless otherwise defined, an "A layer" includes a layer including A as well as a layer consisting of only A.

Throughout the specification, unless otherwise defined, an "A-B alloy layer" includes a layer including an A-B alloy as well as a layer consisting of only an A-B alloy.

Throughout this specification, unless otherwise defined, an "A-B-C alloy layer" includes a layer including an A-B-C alloy as well as a layer consisting of only an A-B-C alloy.

Recently, in order to solve the problems of the hot-dip aluminum plated steel sheet described in the background art, studies have been conducted to improve sacrificial corrosion prevention together with corrosion resistance by adding magnesium to the hot-dip aluminum plated steel sheet containing silicon.

For example, studies have been conducted to manufacture a coated steel sheet having excellent corrosion resistance by manufacturing an Al—Mg—Si plated steel sheet by hot-dip plating. However, in the case of manufacturing the steel sheet by hot-dip plating, there is a problem in that there is a limit to a control of an Mg content and in the case of a thin plating of 20 g/m$^2$ or less, there is a disadvantage in that the corrosion resistance is rapidly deteriorated. Further, an Mg$_2$Si alloy phase is known to improve the corrosion resistance, but in this case, there is a problem in that characteristics are improved only in a small range of around 6% of Mg. The Al—Mg—Si plated steel sheet is known to have excellent corrosion resistance because the Mg$_2$Si phase is formed on the plated layer. The Mg$_2$Si phase has been reported to improve the corrosion resistance of the Al—Mg—Si plated steel sheet when an area ratio in the plated layer is 0.5 or more and 30% or less and a long diameter of the Mg$_2$Si phase is 10 μm or less.

However, since the Al—Mg—Si plated steel sheet manufactured by the hot-dip plating method has a limitation to the control of the Mg content due to the manufacturing process, it is not easy to manufacture the Al—Mg—Si plated steel sheet having a predetermined content or more of Mg content (about 15% or more). Due to the Mg content limitation of the Al—Mg—Si plated steel sheet and a high processing temperature, it is difficult to form an Al$_3$Mg$_2$ phase or an Al$_{12}$Mg$_{17}$ phase in the Al—Mg—Si alloy layer in addition to the Mg$_2$Si phase as an intermetallic compound.

As another example, there are studies on a method of forming an Al—Mg alloy layer by depositing Mg while a substrate coated with aluminum is heated at 350° C. or more and 500° C. or less in vacuum and a method of coating and then heat-treating Mg on the hot-dip aluminum plated steel sheet by physical vapor deposition. However, in these methods, since Mg is deposited on the substrate heated at a high temperature in vacuum, the loss of steam may occur and characteristic change data in accordance with the generation of an intermetallic compound or the intermetallic compound are not presented with respect to an Al—Mg—Si layer.

The present invention is derived to solve the problems of the aforementioned hot-dip aluminum plated steel sheet and the problems of the Al—Mg alloy steel sheet, and according to the present invention, since Mg is coated on the hot-dip aluminum plated steel sheet by a physical vapor deposition method, there is no limitation to the Mg content control of the Al—Mg—Si coated layer and it is possible to manufacture a structure of various coated layers.

Specifically, magnesium is deposited on the hot-dip aluminum plated steel sheet containing silicon to form a multi-layered alloy-coated film through heat treatment, thereby providing an alloy-coated steel sheet having a high corrosion resistance characteristic even in a small thickness while providing sacrificial corrosion prevention.

Hereinafter, a manufacturing method of an alloy-coated steel sheet according to an exemplary embodiment of the present invention and a manufactured alloy-coated steel sheet will be described.

An exemplary embodiment of the present invention provides a manufacturing method of an alloy-coated steel sheet including: preparing an aluminum plated steel sheet including a plated layer containing Al and Si; coating Mg on the aluminum plated steel sheet to form a Mg coated layer; and diffusing Mg to the plated layer by heat-treating the aluminum plated steel sheet coated with Mg.

The steel sheet may be a cold rolled steel sheet. However, the steel sheet is not limited thereto.

The aluminum plated steel sheet may be a hot-dip aluminum plated steel sheet, and specifically, may consist of Si: 8 wt % or more and 10 wt % or less; Al: 88 wt % or more and 90 wt % or less; and a residual amount of Fe with respect to total 100 wt % of the plated layer.

Further, the plated layer of the aluminum plated steel sheet may include an Al—Fe—Si alloy layer and an Al—Si alloy layer formed when aluminum is plated, and the alloy layers may be formed on the steel sheet in order of the Al—Fe—Si alloy layer and the Al—Si alloy layer. The Al—Fe—Si alloy layer may be formed by diffusing Fe in the steel sheet into the Al—Si plated layer when the Al plated steel sheet is manufactured.

The coating of the coating Mg on the aluminum plated steel sheet may be performed by physical vapor deposition (PVD). More specifically, the coating may be performed by electromagnetic levitation physical vapor deposition (EML-PVD). However, the coating method is not limited thereto, and so long as Mg is able to be deposited by physical methods such as an electron beam evaporator, a thermal evaporator, a sputtering source, and a cathodic arc source, Mg may be coated by applying various methods.

The heat treatment method in the heat treating step may be performed by an inductive heating apparatus, but is not limited thereto and other suitable heat-treatment means may be applied. Further, when the heat treatment is performed by methods other than the inductive heating method, a heat treatment temperature may vary according to a heat treatment method. In the present invention, the heat treatment temperature may be 300° C. to 450° C. and a heat treatment time may be in a range of 5 seconds to 600 seconds. Specifically, the heat treatment temperature may be 320° C. to 430° C., 340° C. to 410° C., and 360° C. to 390° C.

Specifically, the heat treatment time may be 40 seconds to 550 seconds, 100 seconds to 500 seconds, 150 seconds to 450 seconds, 200 seconds to 400 seconds, and 250 seconds to 350 seconds.

In the diffusing of Mg into the plated layer by heat-treating the aluminum plated steel sheet coated with Mg, the heat treatment may be performed at a temperature of 300° C. to 450° C.

When the heat treatment temperature is less than 300° C., a lot of time is required in the heat treatment process and thus the manufacturing efficiency is lowered and Al—Mg and Mg—Si alloy phases are not sufficiently generated by the heat treatment to lower a corrosion resistance improvement effect. When the heat treatment temperature is more than 450° C., pores are generated on the plated layer and roughness of the surface of the plated layer is increased to lower the corrosion resistance, and a color of the plated layer becomes darker to deteriorate the productivity. Further, the amount of the Mg—Si alloy phase is larger than that of the Al—Mg alloy phase to increase the sacrificial corrosion prevention and thus there is a possibility of reducing the overall corrosion resistance. Accordingly, it is reasonable that the heat treatment temperature is controlled to 300° C. to 450° C.

In the diffusing of Mg into the plated layer by heat-treating the aluminum plated steel sheet coated with Mg, the heat treatment may be performed for 5 seconds to 600 seconds.

When the heat treatment time is less than 5 seconds, the Al—Mg and Mg—Si alloy phases are not sufficiently generated to lower a corrosion resistance improvement effect. When the heat treatment time is more than 600 seconds, the pores in the plated layer and the surface roughness are increased and the sacrificial corrosion prevention becomes too high due to an increase in Mg—Si alloy phase and thus the corrosion resistance may be lowered. Accordingly, it is reasonable that the heat treatment time is controlled to 5 seconds to 600 seconds.

In the diffusing of Mg into the plated layer by heat-treating the aluminum plated steel sheet coated with Mg, while the heat treatment time passes 60 seconds or more, the Al—Mg alloy phase is generated in the Al—Mg—Si alloy layer and the Al—Mg alloy phase may include $Al_3Mg_2$ and $Al_{12}Mg_{17}$.

Meanwhile, when the heat treatment time passes 200 seconds or more, Mg—Si alloy grains are generated in the Al—Mg—Si alloy layer and the Mg—Si alloy grains may contain $Mg_2Si$.

When the heat treatment time becomes 200 seconds or more, an Mg—Si alloy phase containing $Mg_2Si$ is generated and as a result, since both the Al—Mg alloy phase and the Mg—Si alloy phase are formed, the corrosion resistance of the alloy-coated steel sheet may be improved.

Effects on the corrosion resistance of the alloy-coated steel sheet according to a heat treatment time will be confirmed through the following Examples and Comparative Examples.

An apparatus of FIG. 1 is a schematic view of a continuous coating apparatus which may be used for manufacturing an alloy-coated steel sheet. However, this is just an example of the manufacturing method and is not limited thereto.

The apparatus is configured by a steel sheet supplying device 11 for supplying a hot-dip aluminum plated steel sheet 17 in an atmosphere, an inverse magnetron sputtering source 12 capable of pre-treating the steel sheet in vacuum, a physical vapor deposition (PVD) device 13 for coating Mg after pre-treatment, an inductive heating device 14 capable of heat-treating the steel sheet discharged to the atmosphere, and a steel sheet discharging device 15 for rewinding the heat-treated coated steel sheet again. The PVD device 13 may be an electromagnetic levitation (EML) source. The inverse magnetron sputtering source 12 and the PVD device 13 may be installed and operated in a vacuum container 16.

An exemplary manufacturing method of the alloy-coated steel sheet using the apparatus is as follows. First, the hot-dip aluminum plated steel sheet 17 is prepared and alkaline degreasing may be performed to remove residual oils such as anti-rust oil smeared on the surface of the steel sheet.

Thereafter, the steel sheet is supplied to the vacuum container 16 while being transferred by the steel sheet supplying device 11. Next, the surface cleaning of the steel sheet may be performed by applying power to the inverse magnetron sputtering source 12 installed in the vacuum container 16.

After the cleaning is completed, while the steel sheet is continuously transferred, Mg may be vacuum-coated on the Al plated layer by the EML source 13 installed in the vacuum container 16.

After the coating is completed, the steel sheet is continuously transferred to be discharged to the atmosphere, and then the steel sheet may be heat-treated at a predetermined temperature for a predetermined time using the inductive heating device 14 in the atmosphere.

After the heat treatment is completed, the steel sheet is continuously transferred to obtain the manufactured alloy-coated steel sheet.

Hereinafter, the steel sheet manufactured by the aforementioned manufacturing method will be described. Features of the coated steel sheet found by the present invention are divided into four, and in this specification, the four features are referred to as a first exemplary embodiment to a fourth exemplary embodiment. Hereinafter, the first to fourth exemplary embodiments of the present invention will be described in detail.

First Exemplary Embodiment

Figure 2:
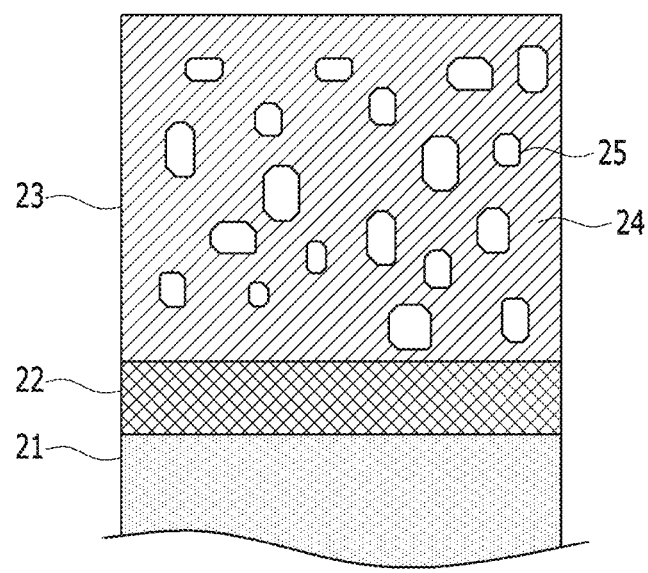
FIG. 2 is a schematic view of an alloy-coated steel sheet according to a first exemplary embodiment of the present invention.

FIG. 2 is a schematic view of an alloy-coated steel sheet according to a first exemplary embodiment of the present invention. When describing with reference to FIG. 2, an alloy-coated steel sheet according to a first exemplary embodiment of the present invention manufactured by the manufacturing method includes a steel sheet 21; and an Al—Mg—Si alloy layer 23 disposed on the steel sheet 21, and the Al—Mg—Si alloy layer 23 may have a form in which Mg—Si alloy grains 25 are included in an alloy layer consisting of an Al—Mg alloy phase 24.

The Al—Mg—Si alloy layer 23 may have a form in which a mixed structure in which the Mg—Si alloy grains 25 are surrounded by the Al—Mg alloy phase 24 is included.

Since the alloy-coated steel sheet is manufactured by coating magnesium on a hot-dip aluminum plated steel sheet by a physical vapor deposition method, an Al—Mg—Si coated layer having a higher magnesium content than an existing hot-dip plating method is able to be manufactured. When the Al—Mg—Si plated steel sheet is manufactured by the hot-dip plating method, there is a limit to a magnesium content control due to a process, and thus it is difficult to manufacture the Al—Mg—Si plated steel sheet having a predetermined content or more of magnesium (about 15% or more). Because of this, in the structure of the plated layer, the Mg—Si alloy phase exists in a form of grains in the aluminum plated layer. As a result, since the Mg—Si alloy phase in the form of grains is difficult to be uniformly dispersed and distributed in the aluminum plated layer, there is a limit in improving the corrosion resistance of the plated layer. Further, in the hot-dip plating process, since the Mg content is limited, there is a problem in that the Al—Mg alloy phase is not sufficiently generated and it is difficult to control a generation location of the Mg—Si alloy phase.

Meanwhile, in the alloy-coated steel sheet according to the first exemplary embodiment of the present invention, it is possible to manufacture the Al—Mg—Si coated layer in which the Mg—Si alloy grains exist in the coated layer formed with the Al—Mg alloy phase unlike the plated layer manufactured by the hot-dip plating method and it is possible to implement sacrificial corrosion prevention and high corrosion resistance characteristics as supported by the embodiments to be described below.

More specifically, the Al—Mg alloy phase may contain $Al_3Mg_2$, and the Mg—Si alloy grains may contain $Mg_2Si$. The Al—Mg alloy phase may further include an $Al_{12}Mg_{17}$ phase.

As such, the Al—Mg—Si alloy layer in which alloy grains of the $Mg_2Si$ phase are included in the alloy layer including the $Al_3Mg_2$ phase is formed to improve the corrosion resistance of the plated steel sheet by increasing the sacrificial corrosion prevention as supported by the embodiments to be described below. As a result, even in a small thickness range, high corrosion resistance may be exhibited.

The Al—Mg alloy phase may include Al other than $Al_3Mg_2$ and $Al_{12}Mg_{17}$ and Mg solid-solutioned in the Al. Accordingly, pure metal contributes to improved corrosion resistance in addition to the Al—Mg and Mg—Si alloy phases to expect an effect of improving insufficient corrosion resistance and sacrificial corrosion prevention of the hot-dip aluminum plated steel sheet.

The Mg—Si alloy grains may be amorphous. The amorphous Mg—Si alloy grains have a large surface area to improve adhesion in the coated layer.

Further, the content of Mg—Si alloy grains in the Al—Mg—Si alloy layer may be 1 wt % or more and 70 wt % or less with respect to total 100 wt % of the Al—Mg—Si alloy layer. When an Al—Mg—Si single layer is formed, the content of Mg—Si alloy grains in the alloy layer may be increased by the sufficient diffusion of Mg. When the content of Mg—Si alloy grains is too small, the corrosion resistance may be slightly improved. When the content of Mg—Si alloy grains is too large, the sacrificial corrosion prevention is increased and thus the coated layer is consumed for a short time and as a result, there is a problem in that the corrosion resistance is decreased.

The alloy-coated steel sheet may further include an Al—Fe—Si alloy layer 22 disposed between the steel sheet 21 and the Al—Mg—Si alloy layer 23, which may be formed by diffusing and introducing Fe in the steel sheet into the Al—Si plated layer when the Al plated steel sheet is manufactured as described above. Alternatively, the Al—Fe—Si alloy layer 22 may be formed by diffusing and introducing Fe in the steel sheet into the Al—Si plated layer when Mg is coated and then heat-treated.

The Al—Fe—Si alloy layer and the Al—Mg—Si alloy layer may prevent corrosion in the sequential manner. As a result, the Al—Fe—Si alloy layer and the Al—Mg—Si alloy layer exhibit excellent corrosion resistance as compared to a general aluminum or zinc plated layer which prevents corrosion by a physical prevention method or a single method such as sacrificial corrosion prevention.

Further, the alloy-coated steel sheet may further include an Mg layer disposed on the Al—Mg—Si alloy layer or an Al—Mg alloy layer formed according to Mg diffusion. As a result, since the corrosion in the sequential manner is reinforced, it is possible to exhibit excellent corrosion resistance.

Second Exemplary Embodiment

Figure 3:
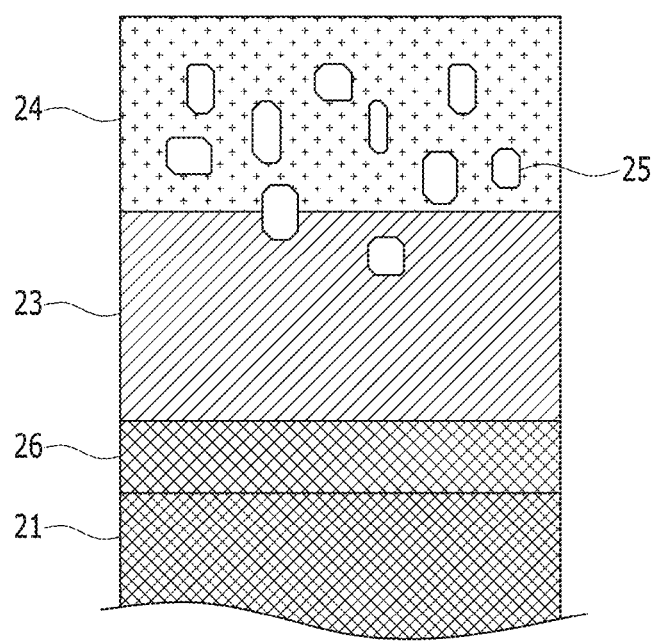
FIG. 3 is a schematic view of an alloy-coated steel sheet according to a second exemplary embodiment of the present invention.

FIG. 3 is a schematic view of an alloy-coated steel sheet according to a second exemplary embodiment of the present invention. When describing with reference to FIG. 3, an alloy-coated steel sheet according to a second exemplary embodiment of the present invention manufactured by the manufacturing method includes a steel sheet 21; an Al—Si alloy layer 26 disposed on the steel sheet; and an Al—Mg—Si alloy layer 23 disposed on the Al—Si alloy layer 26, and the Al—Mg—Si alloy layer 23 may have a form in which Mg—Si alloy grains 25 are included in an alloy layer consisting of an Al—Mg alloy phase 24.

The Al—Mg—Si alloy layer 23 may have a form in which a mixed structure in which the Mg—Si alloy grains 25 are surrounded by the Al—Mg alloy phase 24 is included.

The description for the Al—Mg—Si alloy layer is the same as described in the first exemplary embodiment and will be omitted.

The Al—Si alloy layer may be disposed between the steel sheet and the Al—Mg—Si alloy layer. The Al—Si alloy layer may have existed in an Al hot-dip plated steel sheet, and alternatively, may be newly formed by diffusing Al and Si toward the steel sheet surface during the heat treatment in the manufacturing method.

As a result, the Al—Si alloy layer and the Al—Mg—Si alloy layer may prevent corrosion in the sequential manner.

Furthermore, the alloy-coated steel sheet may further include an Al—Fe—Si alloy layer 22 disposed between the steel sheet 21 and the Al—Mg—Si alloy layer 23, which may be formed by diffusing and introducing Fe in the steel sheet into the Al—Si plated layer when the Al plated steel sheet is manufactured as described above. Alternatively, the Al—Fe—Si alloy layer 22 may be formed by diffusing and introducing Fe in the steel sheet into the Al—Si plated layer when Mg is coated and then heat-treated.

Accordingly, the Al—Fe—Si alloy layer, the Al—Si alloy layer, and the Al—Mg—Si alloy layer may prevent corrosion in the sequential manner. As a result, the Al—Fe—Si alloy layer, the Al—Si alloy layer, and the Al—Mg—Si alloy layer exhibit excellent corrosion resistance as compared to a general aluminum or zinc plated layer which prevents corrosion by a physical prevention method or a single method such as sacrificial corrosion prevention.

Further, the alloy-coated steel sheet may further include an Mg layer disposed on the Al—Mg—Si alloy layer or an Al—Mg alloy layer formed according to Mg diffusion. As a result, since the corrosion in the sequential manner is reinforced, it is possible to exhibit excellent corrosion resistance.

Further, the content of Mg—Si alloy grains in the Al—Mg—Si alloy layer may be 1 wt % or more and 50 wt % or less with respect to total 100 wt % of the Al—Mg—Si alloy layer. When the content of Mg—Si alloy grains is too small, the corrosion resistance may be slightly improved. When the content of Mg—Si alloy grains is too large, the sacrificial corrosion prevention is increased and thus the coated layer is consumed for a short time and as a result, there is a problem in that the corrosion resistance is decreased.

Third Exemplary Embodiment

When describing a third exemplary embodiment with reference to FIG. 2, an alloy-coated steel sheet according to a third exemplary embodiment of the present invention manufactured by the manufacturing method includes a steel sheet 21; and an Al—Mg—Si alloy layer 23 disposed on the steel sheet, and the Al—Mg—Si alloy layer 23 may have a gradient of an Mg content in the alloy layer.

Since the alloy-coated steel sheet is manufactured by coating magnesium on a hot-dip aluminum plated steel sheet by a physical vapor deposition method, there is no limit to a magnesium content control of the Al—Mg—Si alloy layer unlike the related art and the magnesium distribution may be controlled by diffusion heat-treatment and the like, and thus it is possible to manufacture various structures of the Al—Mg—Si alloy layer.

Since the content gradient of Mg in the Al—Mg—Si layer exists, various alloy phases according to an Mg concentration exist to expect a corrosion resistance improvement effect. Examples of various alloy phases may include $Al_{12}Mg_{17}$, $Al_3Mg_2$, $Mg_2Si$, and the like. When these alloy phases exist depending on the Mg concentration gradient, each alloy phase forms a layered structure, and thus there may be an effect of delaying the corrosion of the coated steel sheet.

Specifically, the gradient of the Mg content in the Al—Mg—Si alloy layer may have a form in which the Mg content is decreased inward from the surface of the Al—Mg—Si alloy layer.

Alternatively, the gradient of the Mg content in the Al—Mg—Si alloy layer may have a form in which the Mg content is increased inward from the surface of the Al—Mg—Si alloy layer.

Alternatively, a point in which the Mg content in the Al—Mg—Si alloy layer is maximum is included, and the gradient of the Mg content in the Al—Mg—Si alloy layer may have a form in which the Mg content is increased inward from the surface of the Al—Mg—Si alloy layer and then decreased from the point in which the Mg content is maximum.

Alternatively, the Al—Mg—Si alloy layer includes a content constant portion where the Mg content is constant inward from the surface of the alloy layer and the Mg content may be increased from a point where the content constant portion ends.

Alternatively, the Al—Mg—Si alloy layer includes a content constant portion where the Mg content is constant inward from the surface of the alloy layer and the Mg content may be decreased from the point where the content constant portion ends.

As described above, according to the manufacturing method of the alloy-coated steel sheet of the present invention, since there is no limit to a magnesium content control of the Al—Mg—Si alloy layer and the magnesium distribution may be controlled by diffusion heat-treatment and the like, it is possible to manufacture various structures of the Al—Mg—Si alloy layer. Accordingly, unlike the hot-dip plated steel sheet in which the Mg concentration is uniform, it is possible to manufacture an alloy layer having a layered structure and to expect an effect of maximizing the corrosion resistance by properly combining sacrificial corrosion prevention and blocking corrosion prevention.

Further, the present invention exhibits a high corrosion resistance characteristic as supported by embodiments to be described below.

The alloy-coated steel sheet may further include an Al—Si alloy layer disposed between the steel sheet and the Al—Mg—Si alloy layer.

The Al—Si alloy layer may have existed in an Al hot-dip plated steel sheet, and alternatively, may be newly formed by diffusing Al and Si toward the steel sheet surface during the heat treatment in the manufacturing method.

As a result, the Al—Si alloy layer and the Al—Mg—Si alloy layer may prevent corrosion in the sequential manner.

Furthermore, the alloy-coated steel sheet may further include an Al—Fe—Si alloy layer 22 disposed between the steel sheet 21 and the Al—Mg—Si alloy layer 23, which may be formed by diffusing and introducing Fe in the steel sheet into the Al—Si plated layer when the Al plated steel sheet is manufactured as described above. Alternatively, the Al—Fe—Si alloy layer 22 may be formed by diffusing and introducing Fe in the steel sheet into the Al—Si plated layer when Mg is coated and then heat-treated.

Accordingly, the Al—Fe—Si alloy layer, the Al—Si alloy layer, and the Al—Mg—Si alloy layer may prevent corrosion in the sequential manner. As a result, the Al—Fe—Si alloy layer, the Al—Si alloy layer, and the Al—Mg—Si alloy layer exhibit excellent corrosion resistance as compared to a general aluminum or zinc plated layer which prevents corrosion by a physical prevention method or a single method such as sacrificial corrosion prevention.

Further, the alloy-coated steel sheet may further include an Mg layer disposed on the Al—Mg—Si alloy layer or an Al—Mg alloy layer formed according to Mg diffusion. As a result, since the corrosion in the sequential manner is reinforced, it is possible to exhibit excellent corrosion resistance.

Further, the Al—Mg—Si alloy layer of the alloy-coated steel sheet may have a form in which Mg—Si alloy grains are included in the alloy layer consisting of an Al—Mg alloy phase.

Such a form also contributes to the improved corrosion resistance and the detailed contents are as described above.

Fourth Exemplary Embodiment

When describing a fourth exemplary embodiment with reference to FIG. 2, an alloy-coated steel sheet according to a fourth exemplary embodiment of the present invention manufactured by the manufacturing method includes a steel sheet 21; and an Al—Mg—Si alloy layer 23 disposed on the steel sheet, and the Mg content in the Al—Mg—Si alloy layer 23 may be 15 wt % or more with respect to total 100 wt % of the Al—Mg—Si alloy layer. More specifically, the Mg content may be 15 wt % or more and 90 wt % or less.

Since the alloy-coated steel sheet is manufactured by coating magnesium on a hot-dip aluminum plated steel sheet by a physical vapor deposition method, an Al—Mg—Si coated layer having a higher magnesium content than an existing hot-dip plating method is able to be manufactured. When the Al—Mg—Si plated steel sheet is manufactured by the hot-dip plating method, there is a limit to a magnesium content control due to a process, and thus it is difficult to manufacture the Al—Mg—Si plated steel sheet having a predetermined content or more of magnesium (about 15% or more).

On the contrary, in the alloy-coated steel sheet according to the fourth exemplary embodiment of the present invention, unlike a plated layer manufactured by a hot-dip plating method, there is no limit to the Mg content control and it is possible to manufacture the Al—Mg—Si plated steel sheet having a high content of Mg. As a result, it is possible to implement sacrificial corrosion prevention and high corrosion resistance characteristics as supported by the embodiments to be described below.

The alloy-coated steel sheet may further include an Al—Si alloy layer disposed between the steel sheet and the Al—Mg—Si alloy layer.

The Al—Si alloy layer may have existed in an Al hot-dip plated steel sheet, and alternatively, may be newly formed by diffusing Al and Si toward the steel sheet surface during the heat treatment in the manufacturing method.

As a result, the Al—Si alloy layer and the Al—Mg—Si alloy layer may prevent corrosion in the sequential manner.

Furthermore, the alloy-coated steel sheet may further include an Al—Fe—Si alloy layer 22 disposed between the steel sheet 21 and the Al—Mg—Si alloy layer 23, which may be formed by diffusing and introducing Fe in the steel sheet into the Al—Si plated layer when the Al plated steel sheet is manufactured as described above. Alternatively, the Al—Fe—Si alloy layer 22 may be formed by diffusing and introducing Fe in the steel sheet into the Al—Si plated layer when Mg is coated and then heat-treated.

Accordingly, the Al—Fe—Si alloy layer, the Al—Si alloy layer, and the Al—Mg—Si alloy layer may prevent corrosion in the sequential manner. As a result, the Al—Fe—Si alloy layer, the Al—Si alloy layer, and the Al—Mg—Si alloy layer exhibit excellent corrosion resistance as compared to a general aluminum or zinc plated layer which prevents corrosion by a physical prevention method or a single method such as sacrificial corrosion prevention.

Further, the alloy-coated steel sheet may further include an Mg layer disposed on the Al—Mg—Si alloy layer or an Al—Mg alloy layer formed according to Mg diffusion. As a result, since the corrosion in the sequential manner is reinforced, it is possible to exhibit excellent corrosion resistance.

Further, the Al—Mg—Si alloy layer of the alloy-coated steel sheet may have a form in which Mg—Si alloy grains are included in the alloy layer consisting of an Al—Mg alloy phase.

Such a form also contributes to the improved corrosion resistance and the detailed contents are as described above.

Hereinafter, preferred Examples and Comparative Examples of the present invention will be described. However, the following Examples are just preferred embodiments of the present invention and the present invention is not limited to the following Examples.

EXAMPLES: MANUFACTURING OF ALLOY-COATED STEEL SHEET

Example 1

An Al plated layer containing 9 wt % of Si, 88 wt % of Al, and a residual amount of Fe was formed on a cold rolled steel sheet with a single-sided plating amount of 15 g/m² to prepare a hot-dip aluminum plated steel sheet. A thickness of the Al plated layer was about 5 μm.

Alkaline degreasing was performed to remove residual oils such as anti-rust oil smeared on the surface of the steel sheet.

Thereafter, while the steel sheet was supplied to a vacuum container by a steel sheet supplying device, the surface cleaning of the steel sheet was performed by an inverse magnetron sputtering source installed in the vacuum container.

After the cleaning was completed, while the steel sheet was continuously transferred, Mg was vacuum-coated on the Al plated layer with a thickness of 0.5 μm by an EML source installed in the vacuum container.

After the coating was completed, the steel sheet was continuously transferred to be discharged to the atmosphere, and then the steel sheet was heat-treated using an inductive heating device in the atmosphere. The heat treatment temperature was 400° C. and the heat treatment time was 120 seconds, and after the heat treatment was completed, the steel sheet was continuously transferred to obtain the manufactured alloy-coated steel sheet.

Example 2

Example 2 was manufactured in the same manner as Example 1, but an alloy-coated steel sheet heat-treated for 300 seconds was manufactured.

Example 3

Example 3 was manufactured in the same manner as Example 1, but an alloy-coated steel sheet heat-treated for 600 seconds was manufactured.

Example 4

Example 4 was manufactured in the same manner as Example 1, but an Mg coated layer was coated with a thickness of 1.5 μm and an alloy-coated steel sheet heat-treated for 120 seconds was manufactured.

Example 5

Example 5 was manufactured in the same manner as Example 1, but an Mg coated layer was coated with a thickness of 1.5 μm and an alloy-coated steel sheet heat-treated for 300 seconds was manufactured.

Example 6

Example 6 was manufactured in the same manner as Example 1, but an Mg coated layer was coated with a thickness of 1.5 μm and an alloy-coated steel sheet heat-treated for 600 seconds was manufactured.

Comparative Example 1

An Al plated layer containing 9 wt % of Si, 88 wt % of Al, and a residual amount of Fe was formed on a steel sheet with a single-sided plating amount of 15 g/m² to prepare a hot-dip aluminum plated steel sheet.

Comparative Example 2

An electric zinc-plated steel sheet of a single-sided plating amount of 40 g/m² was prepared.

Comparative Example 3

A hot-dip zinc-plated steel sheet of a single-sided plating amount of 137.5 g/m² was prepared.

EXPERIMENTAL EXAMPLES

Figure 4:
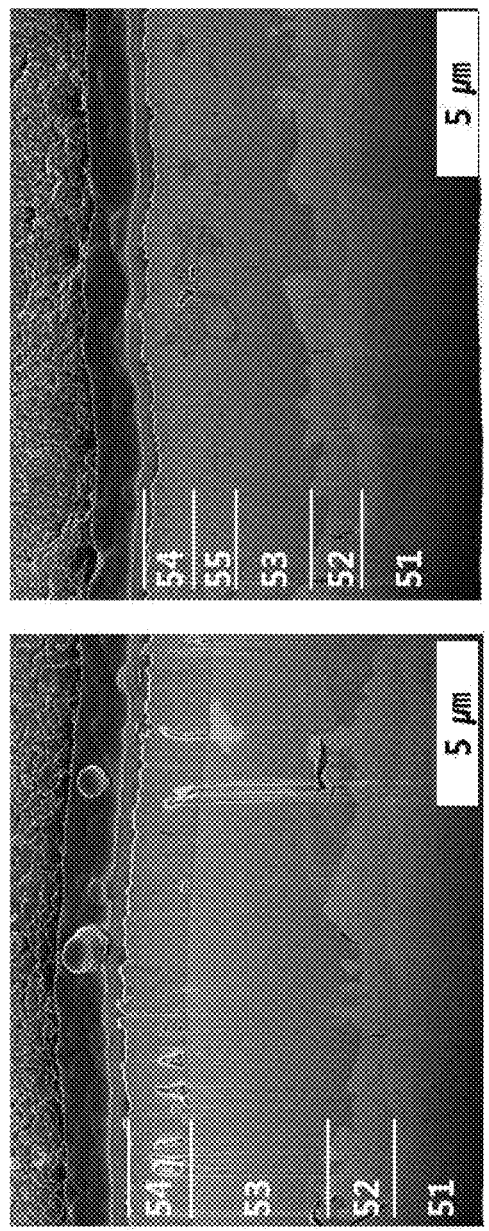
FIG. 4 is a scanning electron microscope (SEM) photograph before and after heat treatment of a hot-dip aluminum plated steel sheet coated with Mg of Example 2.

Experimental Example 1: Observation of Scanning Electron Microscope (SEM) Photograph FIG. 4 is a scanning electron microscope (SEM) photograph before and after heat treatment of a hot-dip aluminum plated steel sheet coated with Mg of Example 2.

FIG. 4A is an SEM photograph of a steel sheet in which Mg is coated on a hot-dip aluminum plated steel sheet and not heat-treated, in which a cold rolled steel sheet 51, an Al—Fe—Si alloy layer 52, an Al—Si alloy layer 53 and an Mg coated layer 54 may be divided.

FIG. 4B is an SEM photograph of Example 2 heat-treated, in which it may be confirmed that Mg is diffused into the Al—Si alloy layer to form an Al—Mg—Si alloy layer 55.

Figure 5:
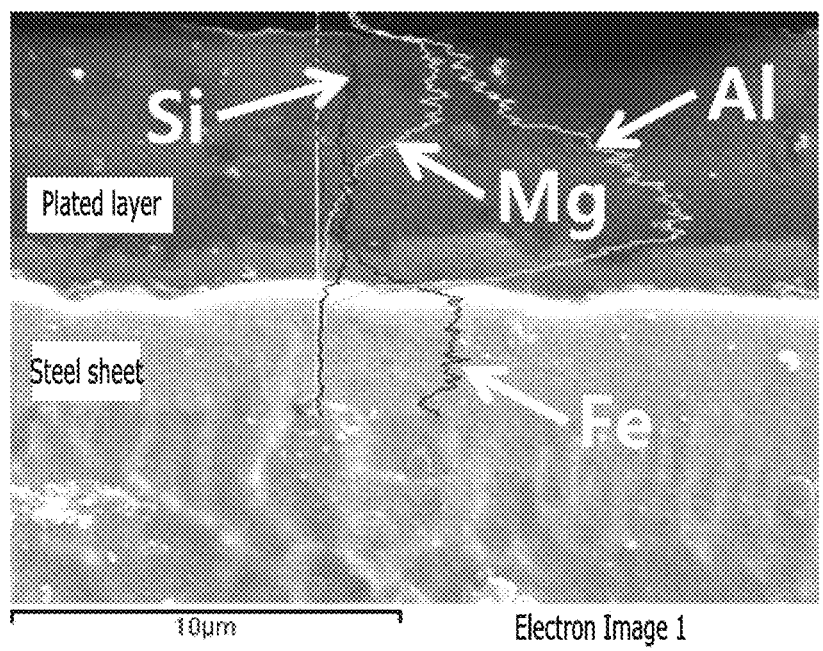
FIG. 5 is an SEM photograph for an alloy-coated steel sheet of Example 4.

FIG. 5 is a SEM photograph for an alloy-coated steel sheet manufactured in Example 4. A content of each component in the coated layer was indicated by a different line, respectively. As can be seen in FIG. 5, it can be seen that the Mg content is highly kept up to a predetermined depth from the surface of the Al—Mg—Si alloy layer and then decreased toward an interface with the steel sheet. Further, it can be seen that the Al—Si plated layer exists.

Experimental Example 2: Glow Discharge Spectrometer Analysis

With respect to the alloy-coated steel sheet manufactured in Example 5, components of the coated layer formed on the steel sheet were analyzed using a glow discharge spectrometer (Device Name: GDS 850A, Manufacturer: LECO).

Figure 6:
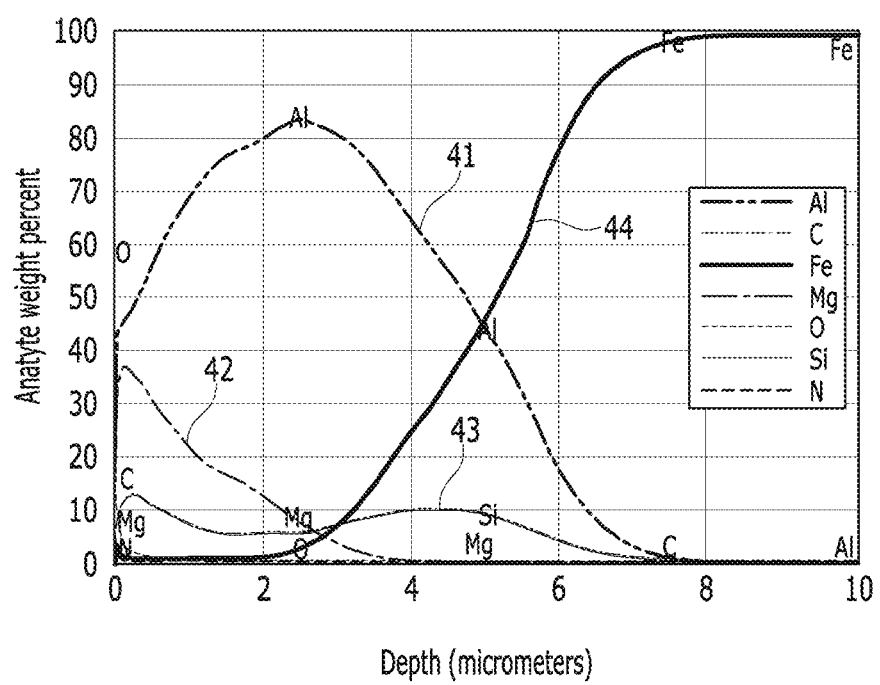
FIG. 6 is a glow discharge spectrometer analysis result for an alloy-coated steel sheet of Example 5.

The results thereof were illustrated in FIG. 6. As illustrated in FIG. 6, it can be seen that Mg is diffused into the hot-dip aluminum plated layer through heat treatment. Further, it can be seen that the Mg content is high on the surface of the Al—Mg—Si alloy layer and then linearly decreased toward the interface with the steel sheet. Further, it can be seen that the Mg content in the Al—Mg—Si alloy layer is 15 wt % or more.

Figure 7:
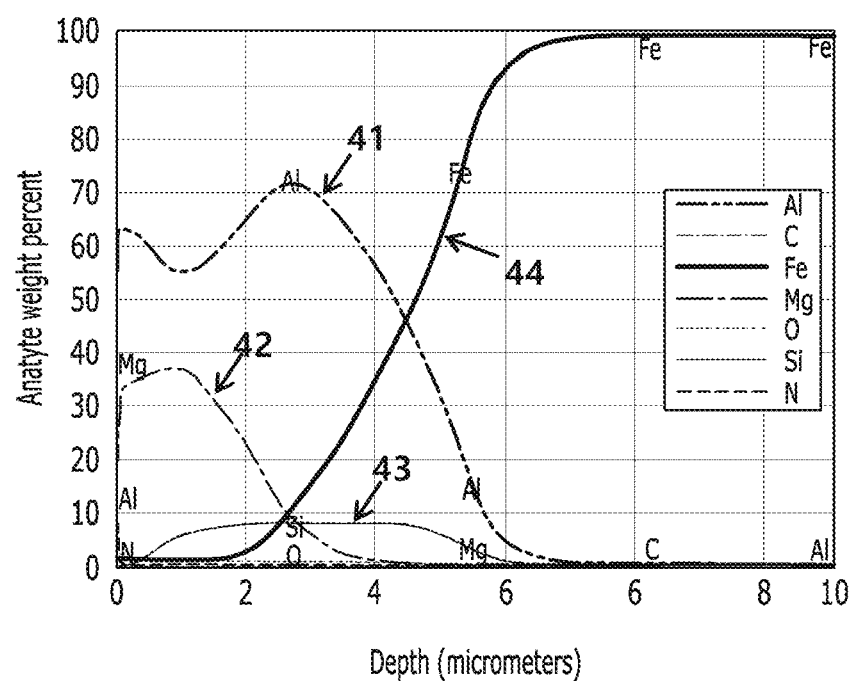
FIG. 7 is a glow discharge spectrometer analysis result for an alloy-coated steel sheet of Example 6.

FIG. 7 is a glow discharge spectrometer analysis result for an alloy-coated steel sheet manufactured in Example 6. As illustrated in FIG. 7, it can be seen that Mg is diffused into the hot-dip aluminum plated layer through heat treatment. Further, it can be seen that the Mg content is increased up to a predetermined depth from the surface of the Al—Mg—Si alloy layer and then decreased toward the interface with the steel sheet. Further, it can be seen that the Mg content in the Al—Mg—Si alloy layer is 15 wt % or more.

Experimental Example 3: Evaluation of Corrosion Resistance

With respect to steel sheet specimens of Example 1 to 6 and Comparative Examples 1 to 3, surface corrosion resistance was evaluated based on initial red rust generation times using a salt spray test (ASTM B-117) method. The results thereof were illustrated in Table 1 below.

coated steel sheet and is expected to be usefully applied to surface treatment of a product requiring high corrosion resistance.

Examples: Comparison of Changes Depending on Heat Treatment Condition

Example 7

Example 7 was manufactured in the same manner as Example 1, but an Mg coated layer was coated with a thickness of 1.0 μm and an alloy-coated steel sheet heat-treated for 120 seconds was manufactured.

Example 8

Example 8 was manufactured in the same manner as Example 1, but an Mg coated layer was coated with a thickness of 1.0 μm and an alloy-coated steel sheet heat-treated for 300 seconds was manufactured.

Example 9

Example 9 was manufactured in the same manner as Example 1, but an Mg coated layer was coated with a thickness of 1.0 μm and an alloy-coated steel sheet heat-treated for 600 seconds was manufactured.

Comparative Example 4

An alloy-coated steel sheet was manufactured in the same manner as Example 1, but an Mg coated layer was coated with a thickness of 1.0 μm and heat treatment was not separately performed.

TABLE 1

| Classification | Plating material | Plating amount (Single-side, g/m$^2$) | Coating material | Coating thickness (μm) | Heat treatment temperature (° C.) | Heat treatment time (second) | Red rust generation time (hour) |
|---|---|---|---|---|---|---|---|
| Example 1 | Al—Si | 15 | Mg | 0.5 | 400 | 120 | 1008 |
| Example 2 | Al—Si | 15 | Mg | 0.5 | 400 | 300 | 1344 |
| Example 3 | Al—Si | 15 | Mg | 0.5 | 400 | 600 | 1176 |
| Example 4 | Al—Si | 15 | Mg | 1.5 | 400 | 120 | 1920 |
| Example 5 | Al—Si | 15 | Mg | 1.5 | 400 | 300 | 2448 |
| Example 6 | Al—Si | 15 | Mg | 1.5 | 400 | 600 | 2064 |
| Example 7 | Al—Si | 15 | Mg | 1.0 | 400 | 120 | 1440 |
| Example 8 | Al—Si | 15 | Mg | 1.0 | 400 | 300 | 2064 |
| Example 9 | Al—Si | 15 | Mg | 1.0 | 400 | 600 | 1920 |
| Comparative Example 1 | Al—Si | 15 | — | — | — | — | 192 |
| Comparative Example2 | Zn | 40 | — | — | — | — | 48 |
| Comparative Example 3 | Zn | 137.5 | — | — | — | — | 288 |
| Comparative Example 4 | Al—Si | 15 | Mg | 1.0 | — | — | 936 |

As can be seen in Table 1, in Comparative Examples 1 to 3, red rust was generated even in less than 300 hours. On the contrary, it can be seen that Examples 1 to 6 have corrosion resistance at least three times to at most about 8 times larger than Comparative Examples.

As a result, the alloy-coated steel sheet of the Al—Mg—Si alloy layer of the present invention has very improved corrosion resistance as compared with an existing alloy- Experimental Example Experimental Example 4: Observation of Scanning Electron Microscope (SEM) Photograph FIG. 8 is an SEM photograph for cross sections of a coated layer before heat treatment and a coated layer heat-treated at 400° C. for 120 seconds, 300 seconds, and 600 seconds.

As illustrated in FIG. 8, before heat treatment, an Mg coated layer and a hot-dip aluminum plated layer are clearly divided. It can be seen that Mg is diffused into the hot-dip aluminum plated layer when the heat treatment starts, and it can be seen that an Mg diffusion depth is also increased when the time is increased.

Until the heat treatment time is about 120 seconds, the diffusion depth of Mg is lowered and thus only an Al—Mg alloy phase is formed and an Mg—Si alloy phase is not formed. When the heat treatment is performed for about 300 seconds, it can be seen that both the Al—Mg alloy phase and the Mg—Si alloy phase are formed and the diffusion of Mg is not diffused to the entire hot-dip aluminum plated layer. When the heat treatment is performed for about 600 seconds, it can be seen that Mg is diffused to the entire plated layer to be alloyed.

Figure 9:
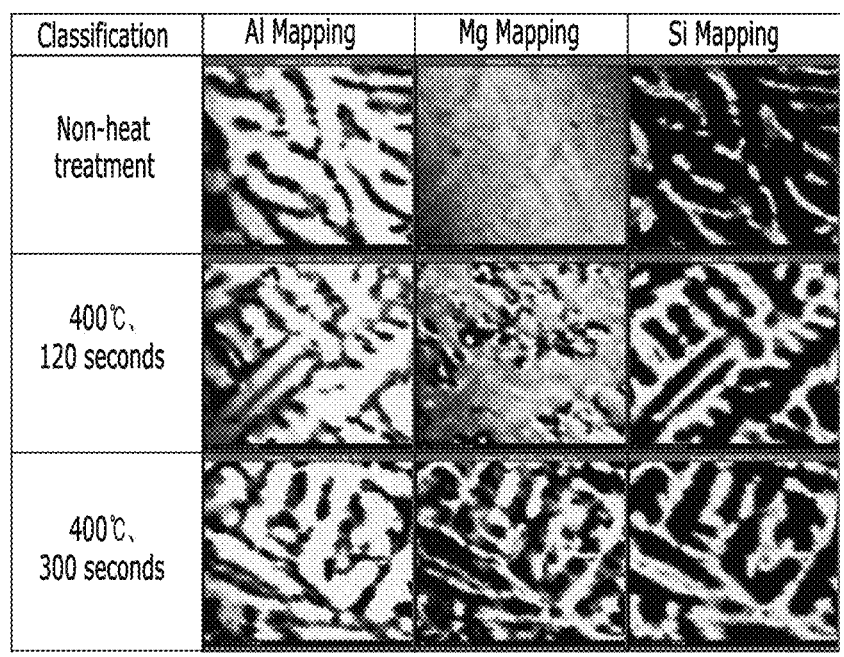
FIG. 9 is an SEM photograph of observing diffusion of three elements of Al, Mg, and Si according to a heat-treatment time on a coated layer surface.

The generation of the alloy phase depending on a change in heat treatment time described above can be seen even on the coated layer, and FIG. 9 is a photograph of observing diffusion of three elements of Al, Mg, and Si according to a heat-treatment time on a coated layer surface by using a scanning electron microscope. As shown in FIG. 9, it can be seen that on the coated layer surface without performing the heat treatment, Al and Si are separated and Mg is coated to be evenly distributed on the surface.

When the heat treatment is performed for about 120 seconds, it may be observed that Mg starts to be diffused to be similar to the distribution of Al, which is a phenomenon occurring when an Al—Mg alloy phase is formed. When the heat treatment is performed for about 300 seconds, it can be seen that Mg is coupled to Si and thus the distributions of Mg and Si become similar to each other.

Figure 10:
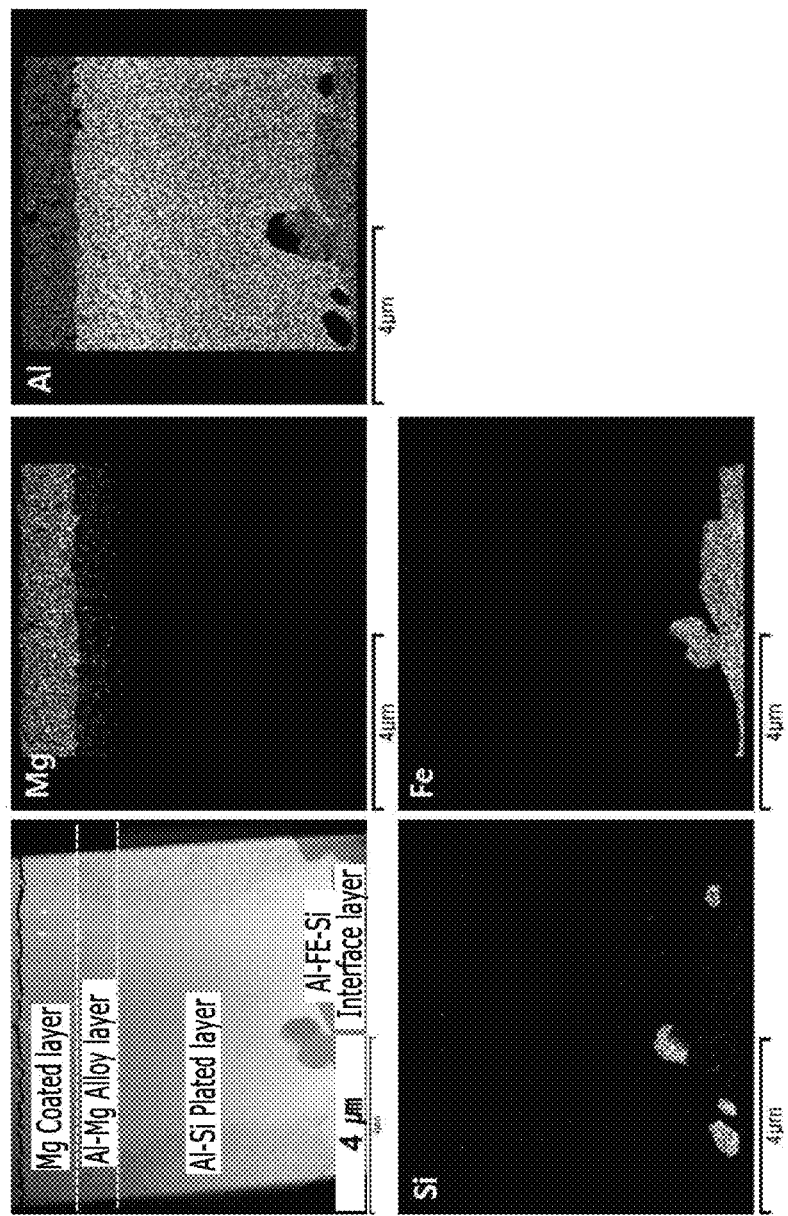
FIG. 10 is a transmission electron microscope (TEM) photograph for an alloy-coated steel sheet of Example 7.

Experimental Example 5: Observation of Transmission Electron Microscope (TEM) Photograph FIG. 10 is a TEM photograph for an alloy-coated steel sheet manufactured in Example 7. Mg was diffused by heat treatment for about 120 seconds. As a result, an Al—Mg alloy layer was formed. An Mg—Si alloy phase was not formed.

Figure 11:
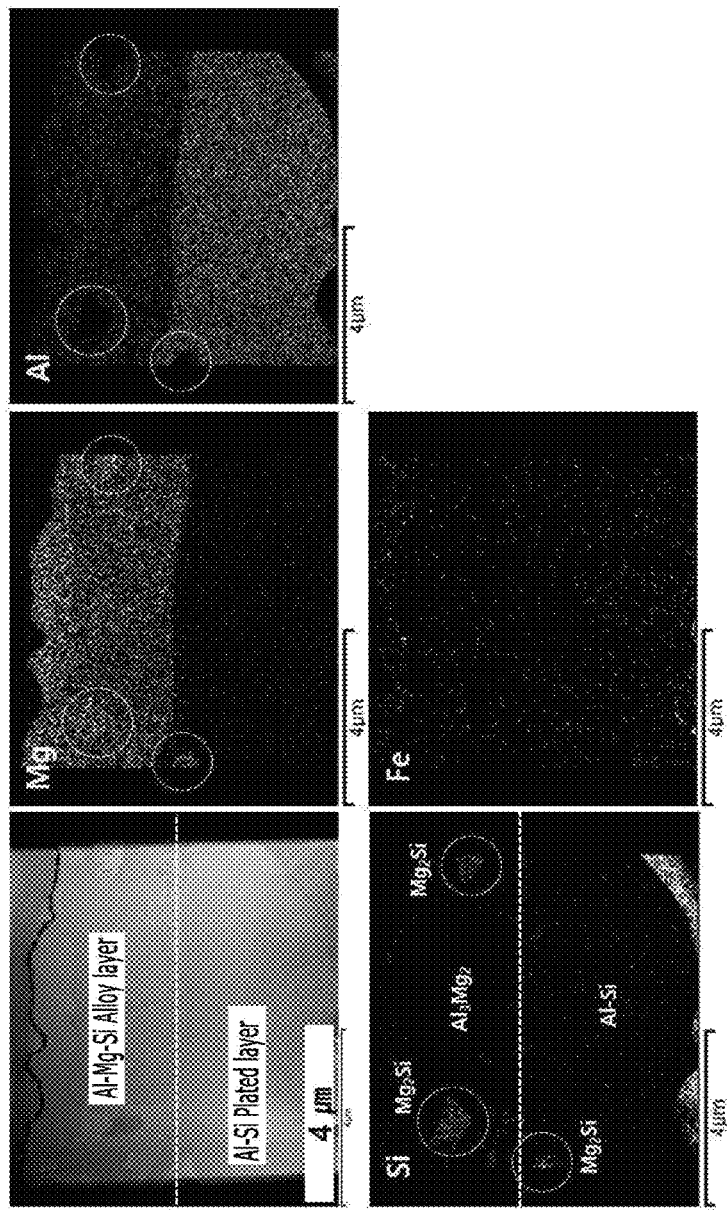
FIG. 11 is a TEM photograph for an alloy-coated steel sheet of Example 8.

FIG. 11 is a TEM photograph for an alloy-coated steel sheet manufactured in Example 8. Mg was diffused to the top of an Al—Si plated layer by heat treatment for about 300 seconds. An Al—Mg—Si alloy layer and an Al—Si plated layer are able to be divided. In the Al—Mg—Si alloy layer, a mixed structure of an Al—Mg alloy phase and an Mg—Si alloy phase may be observed.

Specifically, it can be seen that Mg—Si alloy grains containing $Mg_2Si$ exist in a form to be surrounded by an Al—Mg alloy phase containing $Al_3Mg_2$ in the Al—Mg—Si alloy layer. Further, the Mg—Si alloy grains containing $Mg_2Si$ may be observed in a form to be introduced to the Al—Si plated layer.

Figure 12:
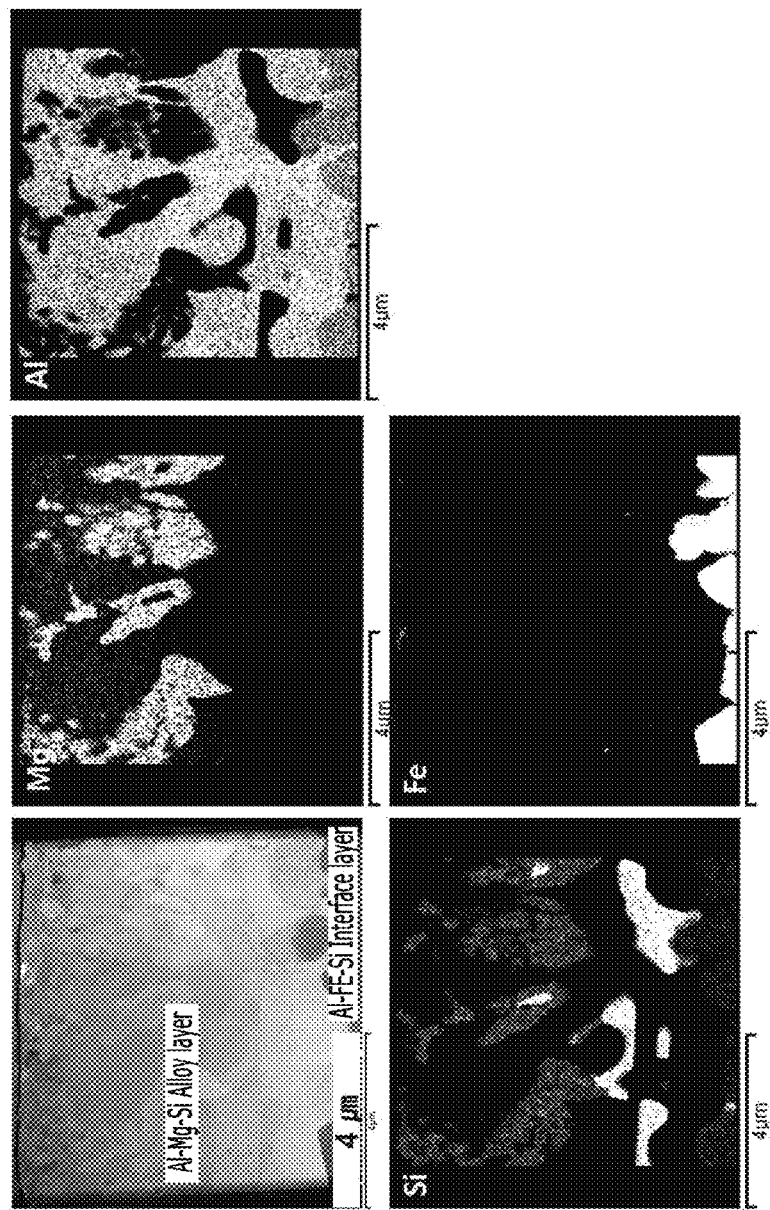
FIG. 12 is a TEM photograph for an alloy-coated steel sheet of Example 9.

FIG. 12 is a TEM photograph for an alloy-coated steel sheet manufactured in Example 9. Mg was diffused to the bottom of an Al—Si plated layer by heat treatment for about 600 seconds. As a result, an Al—Mg—Si alloy layer and an Al—Si plated layer were not divided. In an entire area of the Al—Mg—Si alloy layer, a mixed structure of an Al—Mg alloy phase and an Mg—Si alloy phase is able to be observed.

Figure 13:
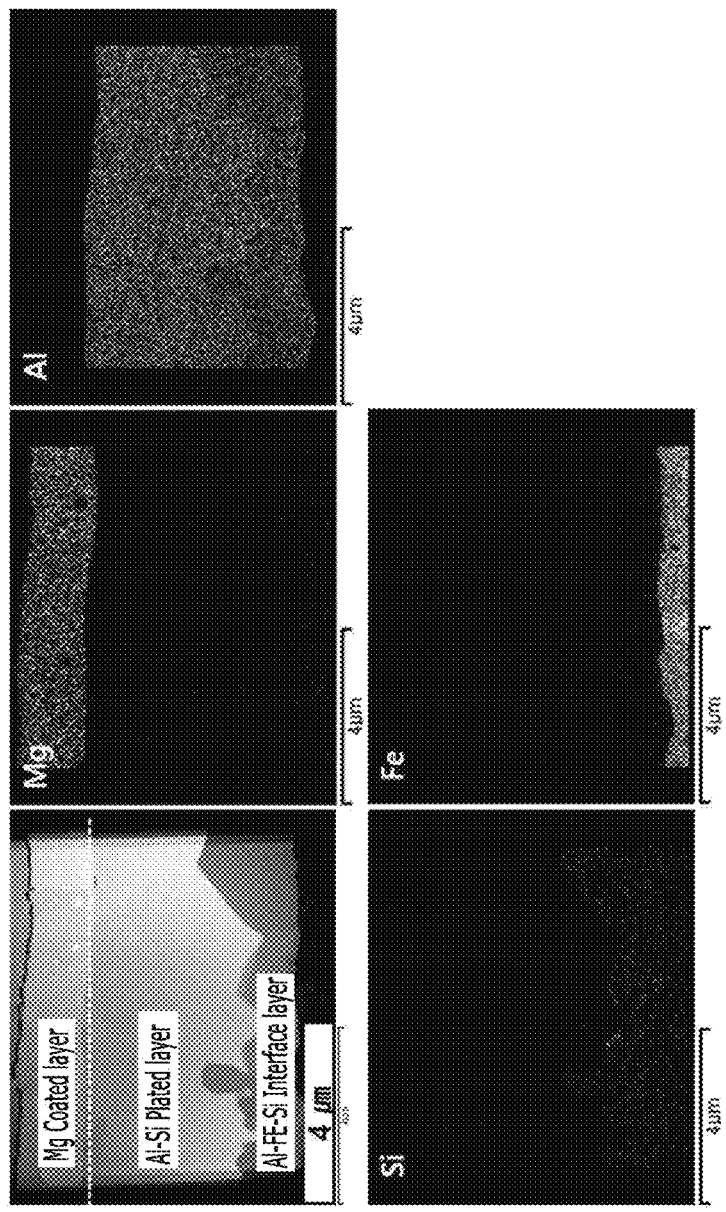
FIG. 13 is a TEM photograph for an alloy-coated steel sheet of Comparative Example 4.

FIG. 13 is a TEM photograph for an alloy-coated steel sheet manufactured in Comparative Example 4. The diffusion of Mg without separate heat treatment did not occur. As a result, an Al—Mg—Si alloy layer was not formed and a mixed structure of an Al—Mg alloy phase and an Mg—Si alloy phase was not able to be observed.

Experimental Example 6: XRD Analysis

With respect to alloy-coated steel sheets manufactured in Example 7, Example 8, Example 9 and Comparative Example 4, XRD analysis was performed by using an X-Ray diffraction device (Device Name: D/MAX-2500V-PC, Manufacturer: Rigaku).

Figure 14:
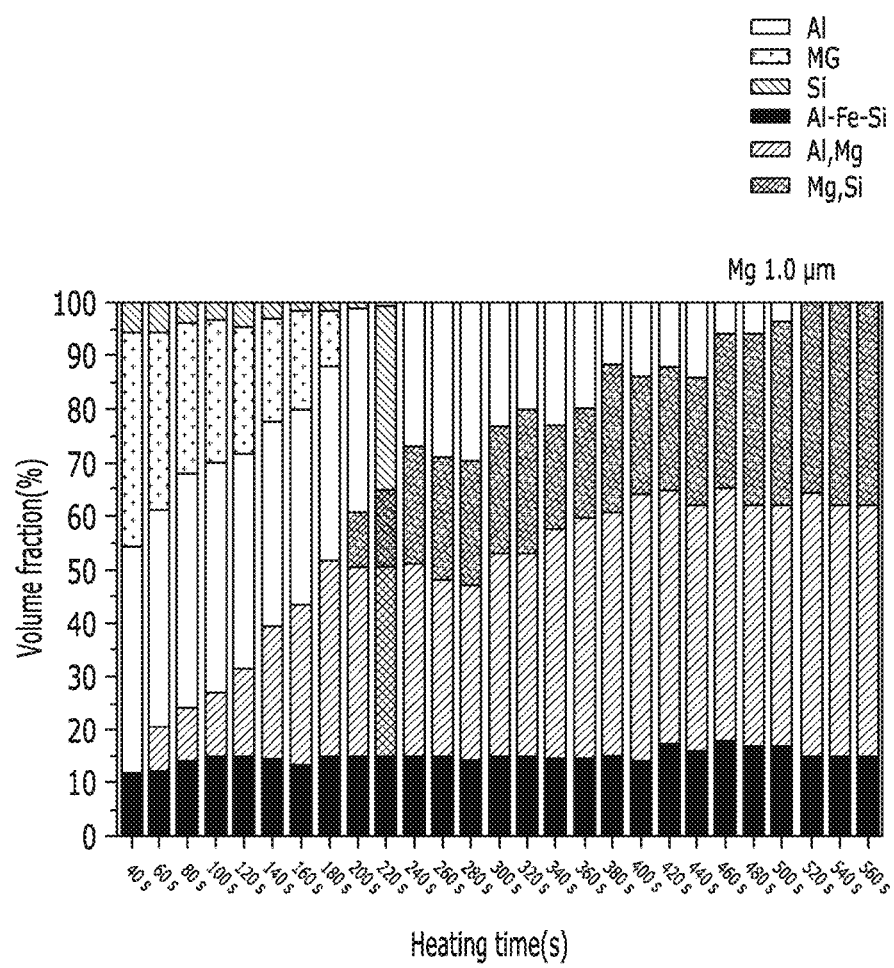
FIG. 14 is a result illustrating a volume fraction for each phase of an alloy-coated steel sheet according to a heat-treatment time at a temperature of about 400° C.

FIG. 14 is a graph showing contents of a metal and an alloy phase existing in a coated layer as a percentage in an X-ray diffraction result of a specimen heat-treated for 600 seconds, 900 seconds, and 3600 seconds while changing a heat treatment time to 60 seconds to 480 seconds in units of 20 seconds.

As can be seen in FIG. 14, when the heat treatment is performed at a temperature of about 400° C., until the heat treatment time is up to 180 seconds from 60 seconds, an Al—Mg alloy phase is generated and as the heat treatment time is increased, a fraction of the Al—Mg alloy phase is increased.

Until the heat treatment time is up to 540 seconds from 200 seconds, an Mg—Si alloy phase is generated and as the heat treatment time is increased, a fraction of the Mg—Si alloy phase is increased. When the heat treatment time is increased, it can be seen that a fraction of pure metal is relatively decreased. It can be seen that the coated layer heat-treated for 600 seconds or more reacts with pure metal to be almost changed to the alloy phase, and it can be seen that a ratio change of the Al—Mg alloy phase and the Mg—Si alloy phase does not occur.

Figure 15:
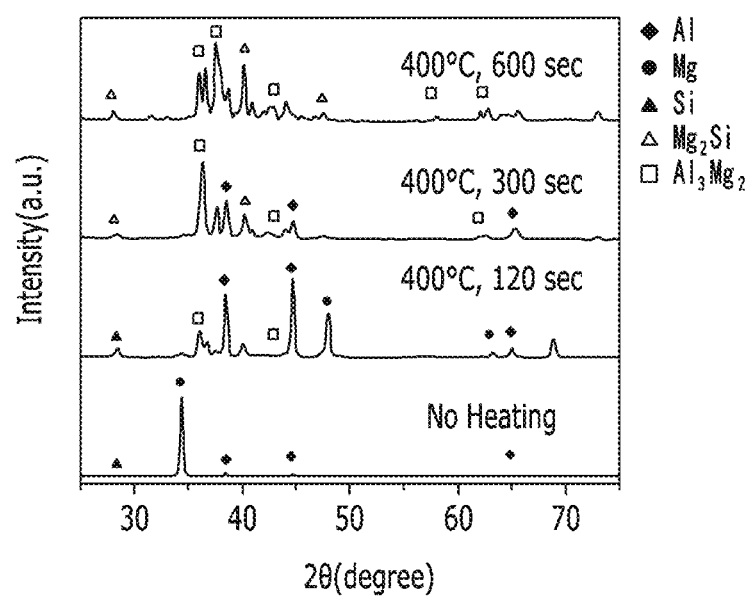
FIG. 15 is X-Ray diffraction analysis results for alloy-coated steel sheets of Example 7, Example 8, Example 9, and Comparative Example 4.

FIG. 15 is X-Ray diffraction analysis results for Al—Mg—Si alloy layers of alloy-coated steel sheets of Example 7, Example 8, Example 9, and Comparative Example 4.

In Example 7 in which the heat treatment for about 120 seconds is performed, an Al—Mg alloy phase ($Al_3Mg_2$) is observed, but an Mg—Si alloy phase ($Mg_2Si$) is not observed. In Example 8 in which the heat treatment for about 300 seconds is performed and Example 9 in which the heat treatment for about 600 seconds is performed, the Al—Mg alloy phase ($Al_3Mg_2$) and the Mg—Si alloy phase ($Mg_2Si$) are shown.

In Comparative Example 4 in which the heat treatment is not performed, single phases of Al, Mg, and Si exist, but the Al—Mg alloy phase and the Mg—Si alloy phase are not shown.

Experimental Example 7: Glow Discharge Spectrometer Analysis

With respect to the alloy-coated steel sheets manufactured in Example 7, Example 8, Example 9, and Comparative Example 4, components of the coated layers formed on the steel sheets were analyzed using a glow discharge spectrometer (Device Name: GDS 850A, Manufacturer: LECO).

Figure 16:
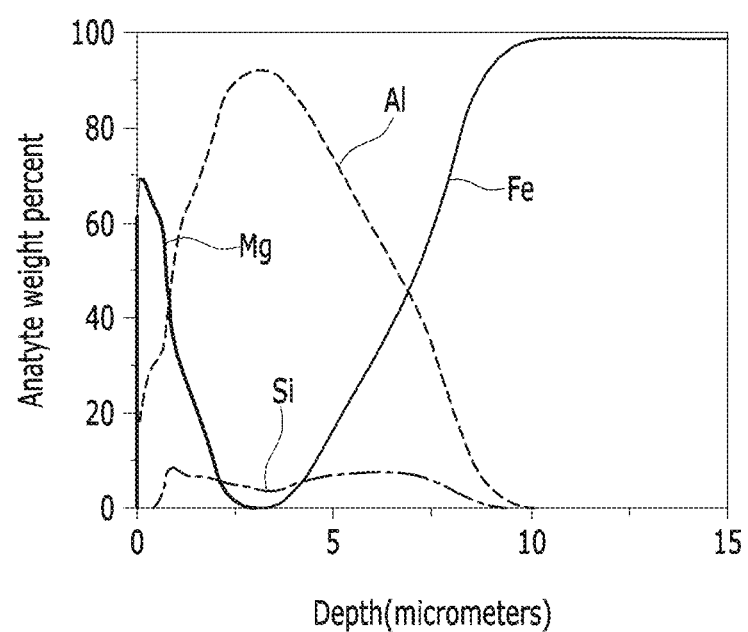
FIG. 16 is a glow discharge spectrometer analysis result for an alloy-coated steel sheet of Example 7.

FIG. 16 is a glow discharge spectrometer analysis result for an alloy-coated steel sheet manufactured in Example 7. It can be seen that Mg is diffused to about 2.5 μm from the surface of the alloy-coated steel sheet by heat treatment for about 120 seconds.

Figure 17:
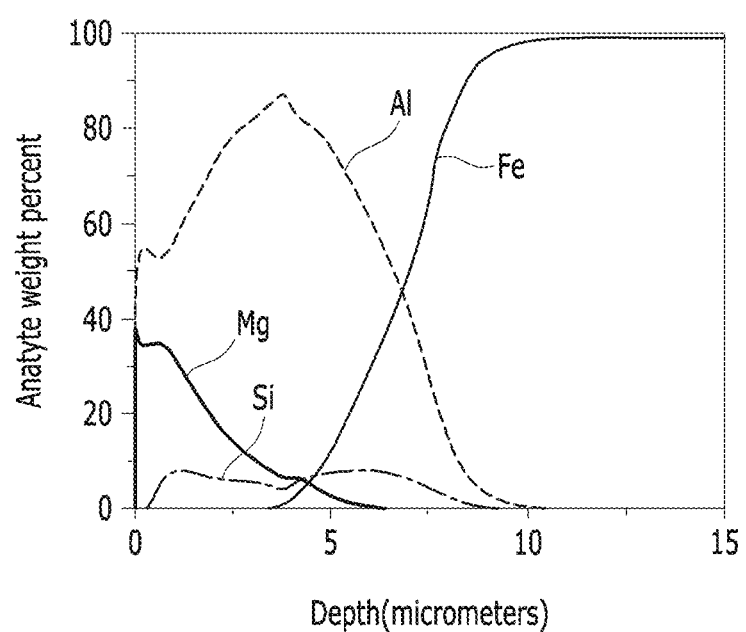
FIG. 17 is a glow discharge spectrometer analysis result for an alloy-coated steel sheet of Example 8.

FIG. 17 is a glow discharge spectrometer analysis result for an alloy-coated steel sheet manufactured in Example 8. It can be seen that Mg is diffused to about 6 μm from the surface of the alloy-coated steel sheet by heat treatment for about 300 seconds.

Figure 18:
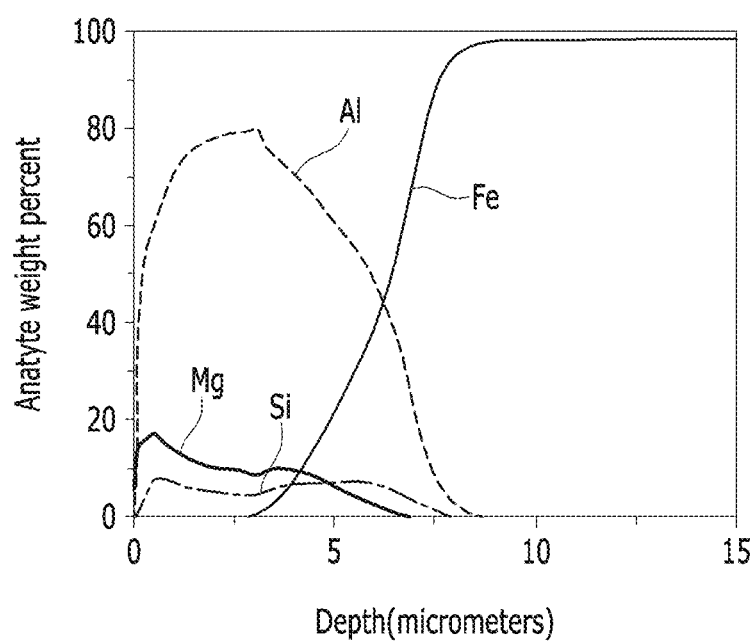
FIG. 18 is a glow discharge spectrometer analysis result for an alloy-coated steel sheet of Example 9.

FIG. 18 is a glow discharge spectrometer analysis result for an alloy-coated steel sheet manufactured in Example 9. It can be seen that Mg is diffused to about 7 μm from the surface of the alloy-coated steel sheet by heat treatment for about 600 seconds.

Figure 19:
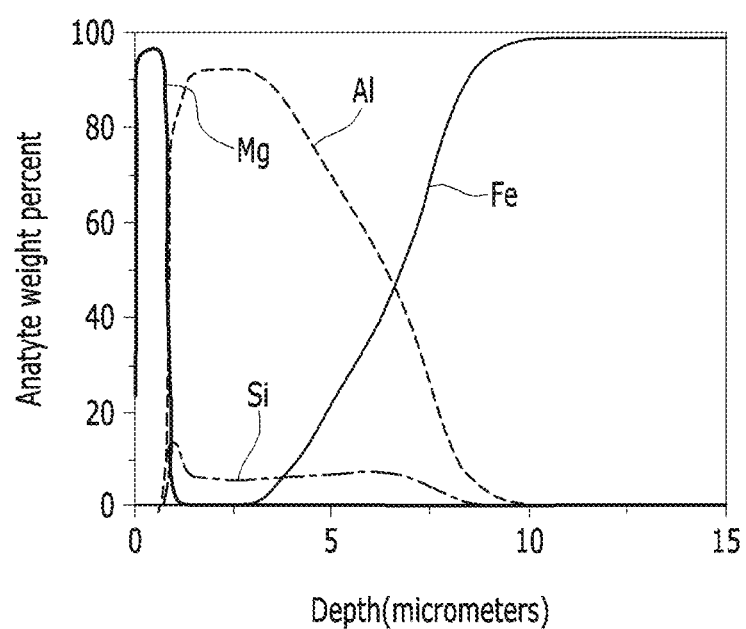
FIG. 19 is a glow discharge spectrometer analysis result for an alloy-coated steel sheet of Comparative Example 4.

On the contrary, FIG. 19 is a glow discharge spectrometer analysis result for an alloy-coated steel sheet manufactured in Comparative Example 4. Since the heat treatment is not performed, Mg is not diffused, but just exists on the surface of the alloy-coated steel sheet.

Experimental Example 8: Evaluation of Corrosion Resistance

Figure 20:
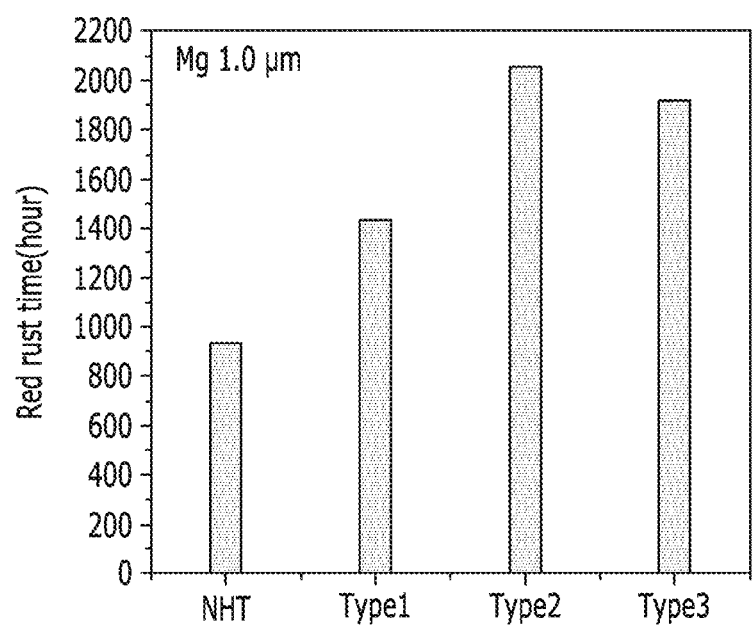
FIG. 20 is a result of evaluating a surface corrosion resistance based on initial red rust generation times of Example 7 (Type-1), Example 8 (Type-2), Example 9 (Type-3), and Comparative Example 4 (NHT).

With respect to alloy-coated steel sheet manufactured in Example 7, Example 8, Example 9 and Comparative Example 4, surface corrosion resistance was evaluated based on initial red rust generation times using a salt spray test (ASTM B-117) method. The results thereof were confirmed in FIG. 20. NHT corresponds to Comparative Example 4 as an alloy-coated steel sheet in which a separate heat treatment is not performed and Type-1, Type-2, and Type-3 correspond to Example 7, Example 8, and Example 9, respectively.

In Example 7, red rust was generated only after about 1440 hours elapsed. In Example 6, red rust was generated only after about 2064 hours elapsed. In Example 7, red rust was generated only after about 1920 hours elapsed.

On the contrary, in Comparative Example 4, red rust was generated after about 936 hours elapsed.

The present invention is not limited to the exemplary embodiments and may be prepared in various different forms, and it will be understood by a person with ordinary skill in the art, to which the present invention pertains, that the exemplary embodiments of the present invention may be implemented in other specific forms without modifying the technical spirit or essential feature of the present invention. Therefore, it will be understood that the aforementioned exemplary embodiments are all illustrative and are not restricted to a limited form.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

| <Description of symbols> | |
|---|---|
| 11: Steel sheet supply device | 12: Inverse magnetron sputtering source |
| 13: Physical vapor deposition device | 14: Inductive heating device |
| 15: Steel sheet discharging device | 16: Vacuum container |
| 17: Hot-dip aluminum plated steel sheet | 21: Steel sheet |
| 22: Al—Si—Fe alloy layer | 23: Al—Mg—Si alloy layer |
| 24: Al—Mg alloy phase | 25: Mg—Si alloy phase |
| 26: Al—Si alloy layer | 41: Aluminum (Al) |
| 42: Magnesium (Mg) | 43: Silicon (Si) |
| 44: Iron (Fe) | 51: Cold rolled steel sheet |
| 52: Al—Fe—Si alloy layer | 53: Al—Si alloy layer |
| 54: Mg layer | 55: Al—Mg—Si alloy layer |

What is claimed is:

1. An alloy-coated steel sheet comprising:
 a steel sheet; and
 an Al—Mg—Si alloy layer disposed on the steel sheet,
 wherein the Al—Mg—Si alloy layer includes: an Al—Mg alloy phase; and Mg—Si alloy grains surrounded by the Al—Mg alloy phase, and
 wherein the Al—Mg alloy phase comprises: $Al_3Mg_2$; $Al_{12}Mg_{17}$; Al; and Mg solid-solutioned in the Al.

2. The alloy-coated steel sheet of claim 1, further comprising:
 an Al—Si alloy layer disposed between the steel sheet and the Al—Mg—Si alloy layer.

3. The alloy-coated steel sheet of claim 1, wherein:
 the Al—Mg—Si alloy layer has a gradient of a Mg content in the Al—Mg—Si alloy layer.

4. The alloy-coated steel sheet of claim 1, wherein:
 the Al—Mg—Si alloy layer has a Mg content of 15 wt % or more and 90 wt % or less with respect to a total weight of the Al—Mg—Si alloy layer.

5. The alloy-coated steel sheet of claim 1, wherein:
 the Mg—Si alloy grains include $Mg_2Si$.

6. The alloy-coated steel sheet of claim 1, wherein:
 the Mg—Si alloy grains are amorphous.

7. The alloy-coated steel sheet of claim 1, wherein:
 the Mg—Si alloy grains have a content of 1 wt % or more and 70 wt % or less with respect to a total weight of the Al—Mg—Si alloy layer.

8. The alloy-coated steel sheet of claim 1, further comprising:

an Al—Fe—Si alloy layer disposed between the steel sheet and the Al—Mg—Si alloy layer.

9. The alloy-coated steel sheet of claim 1, further comprising:
an Mg layer or an Al—Mg alloy layer disposed on the Al—Mg—Si alloy layer.

\* \* \* \* \*